(12) United States Patent
Tamura et al.

(10) Patent No.: US 7,640,807 B2
(45) Date of Patent: Jan. 5, 2010

(54) SEMICONDUCTOR SENSOR

(75) Inventors: Masahide Tamura, Toyama (JP); Masato Ando, Toyama (JP); Yuichi Ishikuro, Toyama (JP)

(73) Assignee: Hokuriku Electric Industry Co., Ltd., Toyama-shi (JP)

( * ) Notice: Subject to any disclaimer, the term of this patent is extended or adjusted under 35 U.S.C. 154(b) by 393 days.

(21) Appl. No.: 11/572,384

(22) PCT Filed: Jul. 7, 2005

(86) PCT No.: PCT/JP2005/013362
§ 371 (c)(1),
(2), (4) Date: Feb. 21, 2007

(87) PCT Pub. No.: WO2006/009194
PCT Pub. Date: Jan. 26, 2006

(65) Prior Publication Data
US 2007/0234804 A1 Oct. 11, 2007

(30) Foreign Application Priority Data
Jul. 21, 2004 (JP) .............................. 2004-212891

(51) Int. Cl.
G01P 15/08 (2006.01)
(52) U.S. Cl. ................... 73/514.33; 73/514.38
(58) Field of Classification Search ............. 73/514.33, 73/514.38, 514.01, 514.36
See application file for complete search history.

(56) References Cited
U.S. PATENT DOCUMENTS
5,734,106 A 3/1998 Caillat

| | | | |
|---|---|---|---|
| 6,848,306 B2 * | 2/2005 | Kunda | 73/514.01 |
| 7,004,030 B2 * | 2/2006 | Ikegami et al. | 73/514.38 |
| 7,100,448 B2 * | 9/2006 | Ikegami | 73/514.33 |
| 2003/0006508 A1 | 1/2003 | Ikezawa et al. | |

FOREIGN PATENT DOCUMENTS

| | | |
|---|---|---|
| JP | 02-151770 | 6/1990 |
| JP | 04-099964 | 3/1992 |
| JP | 05-256869 | 10/1993 |
| JP | 06-112510 | 4/1994 |
| JP | 09-089925 | 4/1997 |
| JP | 2003-166998 | 6/2003 |

* cited by examiner

*Primary Examiner*—John E Chapman
(74) *Attorney, Agent, or Firm*—Rankin, Hill & Clark LLP

(57) ABSTRACT

A semiconductor sensor of the present invention is capable of preventing a diaphragm portion of the sensor from being damaged if a weight collides against a semiconductor integrated circuit substrate of the sensor and is further capable of preventing the diaphragm portion from being bent significantly even when a semiconductor sensor element of the sensor is disposed inside a distorted or deformed casing. A rear surface of the semiconductor integrated circuit substrate 7 is joined onto a wall surface of the casing 9 that defines a receiving chamber of the casing. A support portion of the semiconductor sensor element is joined onto a front surface 7a of the semiconductor integrated circuit substrate 7. A shock absorbing layer is formed on the front surface 7a of the semiconductor integrated circuit substrate 7 at least on a part thereof facing the weight 3 of the semiconductor sensor element 7, for suppressing the bouncing of the weight 3 when the weight 3 collides against the semiconductor integrated circuit substrate 7.

3 Claims, 2 Drawing Sheets

SEMICONDUCTOR SENSOR

TECHNICAL FIELD

The present invention relates to a semiconductor sensor, and especially to a semiconductor sensor capable of detecting acceleration in a predetermined direction that is caused by an externally-added force and gravitational acceleration in a predetermined direction that is applied with the semiconductor sensor being inclined in a stationary state, or relates to a semiconductor sensor used as a gyroscope.

RELATED ART

Japanese Patent No. 3278926 (Patent Document 1) discloses a pressure sensor structure which comprises a semiconductor pressure sensor including a diaphragm portion in a central portion thereof and a cylindrical support portion in an outer peripheral portion thereof, a plate-like semiconductor integrated circuit substrate which is electrically connected with the semiconductor pressure sensor for processing a signal outputted therefrom, and a casing for receiving the semiconductor pressure sensor and the semiconductor integrated circuit substrate. In the pressure sensor structure, the semiconductor pressure sensor is installed on the semiconductor integrated circuit substrate by joining the support portion of the semiconductor pressure sensor on a front surface of the semiconductor integrated circuit substrate.

Patent Document 1: Japanese Patent No. 3278926

DISCLOSURE OF THE INVENTION

Problem to be Solved by the Invention

As with the conventional pressure sensor structure, in a semiconductor sensor provided with a weight, it is contemplated that a support portion of a semiconductor sensor element of the semiconductor sensor may be installed on a semiconductor integrated circuit substrate. However, if the weight collides against the surface of the semiconductor integrated circuit substrate and bounces largely, a diaphragm portion may be damaged by the motion of the weight.

An object of the present invention is to provide a semiconductor sensor capable of preventing the diaphragm portion from being damaged by the motion of the weight even if the weight collides against the surface of the semiconductor integrated circuit substrate.

Another object of the present invention is to provide a semiconductor sensor capable of preventing the diaphragm portion from being bent significantly even if the semiconductor sensor element is disposed in a distorted or deformed casing.

Means for Solving the Problems

A semiconductor sensor according to the present invention comprises a semiconductor sensor element, a semiconductor integrated circuit substrate, and a casing made of an electrical insulating material for receiving the semiconductor sensor element and the semiconductor integrated circuit substrate. The semiconductor sensor element includes a support portion, a diaphragm portion having an outer peripheral portion which is supported by the support portion and made of a semiconductor material, a weight arranged in a central portion of the diaphragm portion, and a sensor element formed in the diaphragm portion and made of a diffused resistor. The semiconductor integrated circuit substrate is electrically connected with the semiconductor sensor element for processing a signal outputted therefrom. A rear surface of the semiconductor integrated circuit substrate is joined onto a wall surface of the casing that defines a receiving chamber of the casing. The support portion of the semiconductor sensor element is joined onto a front surface of the semiconductor integrated circuit substrate. Furthermore, a shock absorbing layer is formed on the front surface of the semiconductor integrated circuit substrate at least on a portion thereof facing the weight of the semiconductor sensor element, for suppressing bouncing of the weight when the weight collides against the semiconductor integrated circuit substrate.

According to the present invention, when the shock absorbing layer is formed on the front surface of the semiconductor integrated circuit substrate on the portion thereof facing the weight, even if the weight collides against the semiconductor integrated circuit substrate, the shock absorbing layer buffers or absorbs an impact of the collision, thereby suppressing bouncing of the weight. In this manner, the motion of the weight is suppressed or restrained so that the diaphragm portion can be prevented from being damaged. Furthermore, since the semiconductor sensor element is disposed on the semiconductor integrated circuit substrate, even if the casing is distorted or deformed, an adhesive is applied to fill up an uneven gap formed between the distorted or deformed casing and the semiconductor integrated circuit substrate, thereby maintaining flatness of the front surface of the semiconductor integrated circuit substrate. With this arrangement, even when the semiconductor sensor element is disposed inside the distorted or deformed casing, the diaphragm portion of the semiconductor sensor element is prevented from being bent significantly.

It is preferred that the shock absorbing layer may also work to protect the front surface of the semiconductor integrated circuit substrate. In this manner, the diaphragm may be prevented from being damaged since the motion of the weight is suppressed, and additionally, a p-type layer, an n-type layer, and other layers, which are formed in the front surface of the semiconductor integrated circuit substrate, may be protected from external forces.

Various kinds of materials may be used for the shock absorbing layer. It is preferred that the shock absorbing layer may be made of a polyimide resin since the motion of the weight may not only be suppressed but also the front surface of the semiconductor integrated circuit substrate may be protected.

In this case, the shock absorbing layer may preferably be 1 to 10 μm in thickness. If the thickness thereof is less than 1 μm, it is hard for the shock absorbing layer to sufficiently suppress the bouncing of the weight. If the thickness exceeds 10 μm, the shock absorbing layer may crack easily.

It is preferred that the support portion and the semiconductor integrated circuit substrate may be adhered to each other with a silicon-based adhesive. In this manner, stress which is generated due to a change in temperature between the support portion and the semiconductor integrated circuit substrate may be reduced, thereby alleviating the stress applied from the adhered portion to the semiconductor sensor element.

BEST MODE FOR CARRYING OUT THE INVENTION

Figure 1:
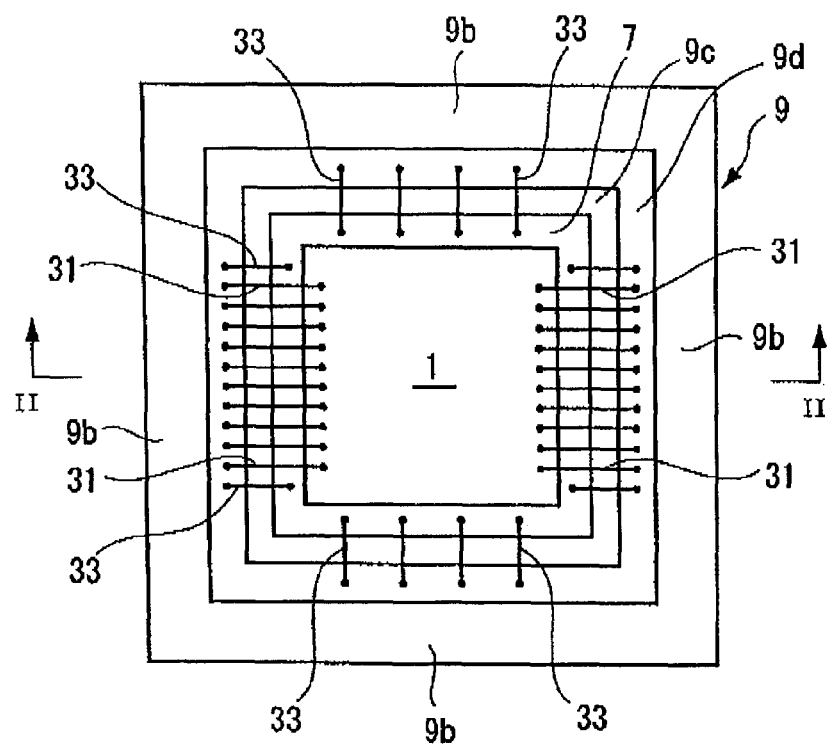
FIG. 1 is a plan view of a semiconductor sensor according to one embodiment of the present invention, when applied to an acceleration sensor.
Figure 2:
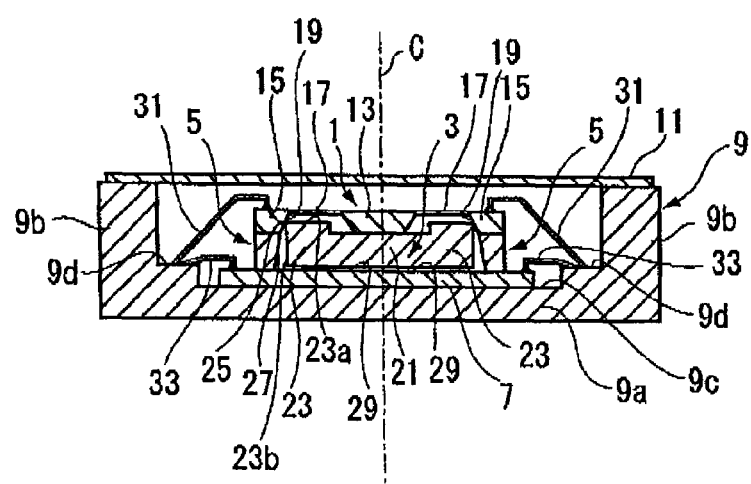
FIG. 2 is a cross-sectional view as taken along line II-II of FIG. 1.

Preferred embodiments of the present Invention will now be described in detail with reference to the accompanying drawings. FIG. 1 is a plan view of the semiconductor sensor according to an embodiment of the present invention, when applied to an acceleration sensor. FIG. 2 is a cross-sectional view as taken along line II-II of FIG. 1. For ease of understanding, a lid portion 11, which will be described later, is omitted from the illustration in FIG. 1. As shown in FIGS. 1 and 2, the semiconductor sensor of this embodiment comprises: a semiconductor sensor element including a sensor body 1, a weight 3, and a pedestal portion 5; a semiconductor integrated circuit substrate 7 on which the pedestal portion 5 is installed; a casing 9 for receiving the semiconductor integrated circuit substrate 7 therein; and a lid portion 11 made of a metal which covers an opening of the casing 9. The sensor body 1 is formed by anisotropic etching from a semiconductor crystal substrate made of single crystal silicon. The sensor body 1 includes a weight fixing portion 13 located in a central portion thereof, a cylindrical supporting part 15 located in an outer peripheral portion thereof, and a flexible diaphragm portion 17 located between the weight fixing portion 13 and the supporting part 15. In this embodiment, the support portion is constituted by the supporting part 15 and the pedestal portion 5.

A plurality of sensor elements respectively made of a diffused resistor for detecting acceleration are formed on the diaphragm portion 17 on the surface of the sensor body 1. A plurality of electrodes are formed on the supporting part 15. In the semiconductor sensor of this embodiment, the diaphragm portion 17 is bent when the weight 3 is moved due to acceleration caused by an externally-added force or by a force based on gravitational acceleration applied with the semiconductor sensor being inclined in a stationary state. Resistance values of the respective diffused resistors constituting the sensor element will accordingly vary. Thus, three-axis accelerations are detectable based on the amount of the bending of the diaphragm portion.

The weight fixing portion 13 is shaped to protrude from the diaphragm portion 17 toward the weight 3. The weight fixing portion 13 has a polygonal cross section, and its outer peripheral surface is Inclined away from the supporting part 15 as it is becoming more distant from a side where the diaphragm portion 17 is located.

The supporting part 15 is an annular rectangle in shape, and its inner peripheral surface is constituted by four trapezoidal inclined surfaces 19 of a substantially identical shape which are annularly combined so as to define an outer peripheral surface of a truncated pyramidal internal space of the supporting part 15. The inclined surfaces 19 are inclined toward a centerline C, which will be described later, as they become closer to the side where the diaphragm portion 17 is located. With the above-described configuration of the inner peripheral surface of the supporting part 15, the internal space of the supporting part 15 including the weight fixing portion 13 is a truncated pyramid in shape whose cross-sectional area becomes smaller toward the diaphragm portion 17.

The weight 3 is made of tungsten, having a disc-like outline. The weight is fixed to the weight fixing portion 13 in such a manner that the centerline C passing through the center of the weight fixing portion 13 and extending in a direction orthogonal to an extending direction of the diaphragm portion 17 may also pass through the center of gravity of the weight 3. The weight 3 integrally includes a fixed portion 21 which is fixed to the weight fixing portion 13 and a body portion 23 disposed apart from the diaphragm portion 17 with a space therebetween. The fixed portion 21 is columnar in shape, having a top face fixed to the weight fixing portion 13. The body portion 23 is substantially cylindrical in shape, having an annular top face 23a and a side face 23b defining the circumference of the body portion 23. The top face 23a is located higher than the fixed portion 21. An angle portion 25 formed between the top face 23a and the side face 23b closely faces the inclined surfaces 19 of the supporting part 15. With this arrangement, if the weight 3 is caused to move more than necessary, the angle portion 25 of the weight 3 gets in contact with the inclined surfaces 19 of the supporting part 15 and displacement of the weight 3 will consequently be limited within a predetermined range.

The pedestal portion 5 is an annular rectangle in shape, and is connected with the supporting part 15 to receive the supporting part 15 thereon. An inner peripheral surface of the pedestal portion 5 is constituted by four trapezoidal inclined surfaces 27 of a substantially identical shape which are annularly combined so as to define an outer peripheral surface of a truncated pyramidal space. The inclined surfaces 27 are inclined toward the centerline C as they become closer to the side where the diaphragm portion 17 is located.

Figure 3:
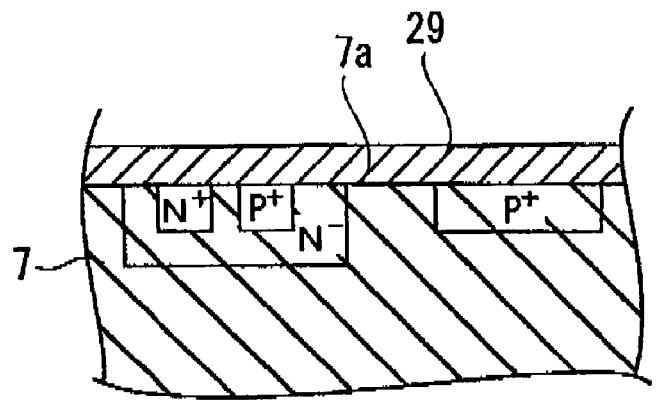
FIG. 3 is an enlarged partial cross-sectional view of the semiconductor sensor shown in FIG. 1.

As shown in FIG. 3, the semiconductor integrated circuit substrate 7 has a substantially rectangular plate-like shape, including a flat front surface 7a. The semiconductor integrated circuit substrate 7 is formed in such a manner that a circuit including a p-type layer, an n-type layer, an electrode layer, and other layers is partially exposed on the front surface 7a. The pedestal portion 5 is installed on the front surface 7a, facing the weight 3. In this embodiment, the front surface 7a and the pedestal portion 5 are adhered to each other by a silicon-based adhesive. A shock absorbing layer 29 is formed on the front surface 7a in an area thereof surrounded by the pedestal portion 5. The shock absorbing layer 29 is made of a polyimide resin, and has a thickness dimension of 1 to 10 μm. The shock absorbing layer 29 works to suppress bouncing of the weight 3 when the weight 3 collides against the semiconductor integrated circuit substrate 7, and also to protect the front surface 7a of the semiconductor integrated circuit substrate 7. In this embodiment, although the shock absorbing layer 29 is formed on the front surface 7a only in the area surrounded by the pedestal portion 5, it may be sufficient to form the shock absorbing layer on the front surface 7a of the semiconductor integrated circuit substrate 7 at least on a portion thereof facing the weight. Accordingly, the shock absorbing layer may be formed all over the front surface of the semiconductor integrated circuit substrate, or all over the whole surface of the semiconductor integrated circuit substrate.

The casing 9 is made of a ceramics material and has a rectangular bottom wall 9a and four side walls 9b rising from the edge of the bottom wall 9a. A rectangular bottom portion 9c, on which the semiconductor integrated circuit substrate 7 is disposed, is formed in a central portion of the bottom wall 9a. An annular bottom portion 9d is formed around the rectangular bottom portion 9c to be located in a different level from that of the rectangular bottom portion 9c. In this embodiment, a rear surface of the semiconductor integrated circuit substrate 7 and a wall surface of the bottom wall 9a of the casing 9 are adhered to each other with an epoxy-based adhesive. A plurality of electrodes are disposed on a surface of the annular bottom portion 9d. Some of the electrodes disposed on the annular bottom portion 9*d* and the plurality of electrodes disposed on the supporting part 15 are electrically connected by conductive wires 31. Similarly, other electrodes disposed on the surface of the annular bottom portion 9*d* and the plurality of electrodes disposed on the semiconductor integrated circuit substrate 7 are electrically connected by electric conduction wires 33.

According to the semiconductor sensor of this embodiment, since the shock absorbing layer 29 is formed on the front surface 7*a* of the semiconductor integrated circuit substrate 7, even if the weight 3 moves up and down to collide against the semiconductor Integrated circuit substrate 7, the shook absorbing layer 29 may buffer or absorb an impact of the collision, thereby suppressing the bouncing of the weight 3. In this manner, the motion of the weight 3 may be suppressed or restrained, thereby preventing the diaphragm portion 17 from being damaged. In addition, since the semiconductor sensor element is disposed on the semiconductor integrated circuit substrate 7, even if the bottom wall 9*a* of the casing 9 is distorted or deformed, an adhesive is applied to fill up an uneven gap formed between the distorted or deformed bottom wall 9*a* and the semiconductor integrated circuit substrate 7, thereby preventing the semiconductor integrated circuit substrate 7 from being distorted or deformed. Thus, the flatness of the front surface 7*a* can be maintained. In this manner, even if the semiconductor sensor element is disposed inside the distorted or deformed casing 9, the diaphragm portion 17 of the semiconductor sensor element can be prevented from being significantly bent.

Figure 4:
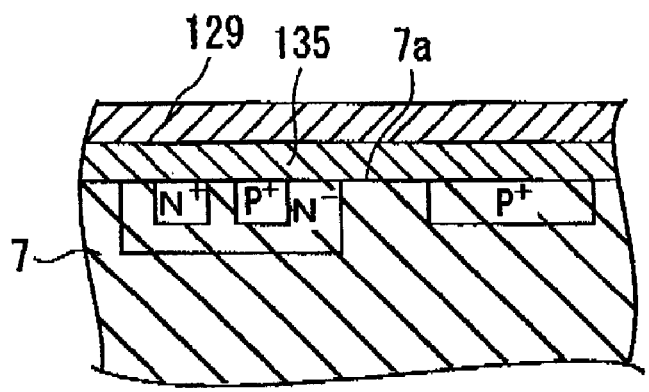
FIG. 4 is an enlarged partial cross-sectional view of a semiconductor sensor according to another embodiment of the present invention.

In the above-mentioned embodiment, the shock absorbing layer 29 is formed on the front surface 7*a* of the semiconductor integrated circuit substrate 7. A protective layer 135 for protecting the circuit including a p-type layer etc, may be formed on the front surface 7*a* of the semiconductor integrated circuit substrate 7 and the shock absorbing layer 129 may be formed on the protective layer 135 as shown in FIG. 4.

In the above-mentioned embodiment, the present invention is applied to the semiconductor sensor provided with the pedestal portion 5. The present invention is also applicable to a semiconductor sensor without a pedestal portion. In this case, a supporting part will be installed on the front surface of the semiconductor integrated circuit substrate.

INDUSTRIAL APPLICABILITY

According to the present invention, it is possible to suppress the bouncing of the weight even if the weight collides against the semiconductor integrated circuit substrate since the shock absorbing layer buffers or absorbs an impact of the collision, Accordingly, displacement of the weight is suppressed or restrained and the diaphragm portion can be prevented from being damaged. In addition, even if the semiconductor sensor element is disposed in the distorted or deformed casing, the diaphragm portion of the semiconductor sensor element can be prevented from being significantly bent.

The invention claimed is:

1. A semiconductor sensor comprising:
  a semiconductor sensor element including:
    a support portion;
    a diaphragm portion having an outer peripheral portion which is supported by the support portion, and made of a semiconductor material;
    a weight arranged in a central portion of the diaphragm portion; and
    a sensor element formed in the diaphragm portion and made of a diffused resistor;
  a semiconductor integrated circuit substrate electrically connected with the semiconductor sensor element for processing a signal outputted therefrom; and
  a casing made of an electrical insulating material for receiving the semiconductor sensor element and the semiconductor integrated circuit substrate,
  wherein a rear surface of the semiconductor integrated circuit substrate is joined onto a wall surface of the casing that defines a receiving chamber of the casing;
  wherein the support portion of the semiconductor sensor element is joined onto a front surface of the semiconductor integrated circuit substrate; and
  wherein a shock absorbing layer made of polyimide resin having a thickness of 1-10 μm is formed on the front surface of the semiconductor integrated circuit substrate at least on a portion thereof facing the weight of the semiconductor sensor element, for suppressing bouncing of the weight when the weight collides against the semiconductor integrated circuit substrate.

2. The semiconductor sensor according to claim 1, wherein the shock absorbing layer also works to protect the front surface of the semiconductor integrated circuit substrate.

3. The semiconductor sensor according to claim 1, wherein the support portion and the semiconductor integrated circuit substrate are adhered to each other with a silicon-based adhesive.

* * * * *

UNITED STATES PATENT AND TRADEMARK OFFICE
CERTIFICATE OF CORRECTION

PATENT NO.       : 7,640,807 B2                    Page 1 of 1
APPLICATION NO.  : 11/572384
DATED            : January 5, 2010
INVENTOR(S)      : Tamura et al.

It is certified that error appears in the above-identified patent and that said Letters Patent is hereby corrected as shown below:

On the Title Page, item (22), under "PCT Filed", in Column 1, Line 1, delete "Jul. 7, 2005" and insert -- Jul. 21, 2005 --, therefor.

Signed and Sealed this

Sixth Day of April, 2010

David J. Kappos
*Director of the United States Patent and Trademark Office*